United States Patent [19]
Nagao

[11] Patent Number: 5,215,935
[45] Date of Patent: Jun. 1, 1993

[54] METHOD OF FORMING ISOLATION REGION IN SEMICONDUCTOR DEVICE

[75] Inventor: Shigeo Nagao, Hyogo, Japan

[73] Assignee: Mitsubishi Denki Kabushiki Kaisha, Tokyo, Japan

[21] Appl. No.: 750,839

[22] Filed: Aug. 29, 1991

[30] Foreign Application Priority Data

Aug. 31, 1990 [JP] Japan .................................. 2-231939

[51] Int. Cl.[5] .......................................... H01C 21/76
[52] U.S. Cl. ...................................... 437/69; 437/968
[58] Field of Search ................................ 437/69, 968; 148/DIG. 85, DIG. 86, DIG. 117

[56] References Cited

FOREIGN PATENT DOCUMENTS

| 0035690 | 9/1981 | European Pat. Off. | 437/69 |
|---|---|---|---|
| 63-86552 | 4/1988 | Japan | 437/69 |
| 59-15044 | 8/1989 | Japan | 437/69 |
| 212942 | 1/1990 | Japan | 437/69 |

OTHER PUBLICATIONS

Publication entitled, "The Influence of the LOCOS Processing Parameters on the Shape of the Bird's Beak Structure", by T.-C. Wu et al., Philips Research Laboratories, Jul. 1983, pp. 1563–1566.

Publication entitled "Application of Selective Silicon Epitaxial Growth for CMOS Technology", by Shigeo Nagao et al., IEEE Tansactions on Electron Devices, vol. ED-38, No. 11 (Nov. 1986), pp. 1738–1744.

Primary Examiner—George Fourson
Attorney, Agent, or Firm—Lowe, Price, LeBlanc & Becker

[57] ABSTRACT

A method of forming a isolation region in a semiconductor device includes the steps of forming an underlying oxide film on a semiconductor substrate, forming a first polysilicon layer on the underlying oxide film, forming a silicon nitride film on the first polysilicon layer, patterning the silicon nitride film such that the silicon nitride film is left only on a circuit element region of the substrate at which a circuit element is to be formed, depositing selectively a second polysilicon layer by vapor deposition on regions of the first polysilicon layer which are exposed by patterning, and forming isolation regions of silicon oxide by thermally oxidizing at least the second and the first polysilicon layers using the patterned nitride film as a mask.

9 Claims, 3 Drawing Sheets

METHOD OF FORMING ISOLATION REGION IN SEMICONDUCTOR DEVICE

BACKGROUND OF THE INVENTION

1. Field of the Invention

The present invention relates to a method of manufacturing a semiconductor device and, more specifically, to an improvement of a method of forming isolation regions for electrically separating circuit elements in semiconductor devices.

2. Description of the Background Art

In a semiconductor integrated circuit including an FET (Field Effect Transistor), a bipolar transistor, a diode, a capacitor, a register and so on formed on a silicon substrate, means for electrically separating these circuit elements is necessary. Generally, a isolation region of a silicon oxide film, which is a highly dielectric material, is utilized as the separating means. In order to form the isolation region of the silicon oxide film, known LOCOS (Local Oxidation of Silicon) method is generally used.

FIGS. 1A to 1C are cross sectional views showing one example of steps for forming the isolation regions by the conventional LOCOS method.

Referring to FIG. 1A, an underlying silicon oxide film 12 is formed on a silicon substrate 11 to have the thickness of about 500 Å by thermal oxidation. On the underlying silicon oxide film 12, a silicon nitride film 13 having the thickness of about 1000 Å is deposited by, for example, CVD (Chemical Vapor Deposition). The underlying oxide film 12 is provided for releasing stress applied by silicon nitride film 13 to silicon substrate 11.

Referring to FIGS. 1A and 1B, silicon nitride film 13 is patterned by etching using photolithography such that silicon nitride film 13a is left only on a circuit element region 19 of silicon substrate 11 at which a circuit element is to be formed. More specifically, at regions where isolation regions are to be formed, underlying silicon oxide film 12 is exposed.

Referring to FIGS. 1B and 1C, silicon substrate 11 is thermally oxidized in an oxygen atmosphere using the patterned silicon nitride film 13a as a mask, and isolation regions 14 of silicon oxide film having the thickness of about 5000 Å are formed.

Thereafter, the pattern 13a of silicon nitride film is removed, and a circuit element is formed by a known method in the circuit element region 19a surrounded by the isolation regions 14.

However, as shown in FIG. 1C, in the LOCOS method, reaction of oxidization of silicon substrate 11 proceeds not only in the vertical direction but also to regions below edges of silicon nitride film 13a, and therefore, bird's beak portions 15 are unavoidably formed at the isolation regions 14. The circuit element region 19a after the formation of isolation regions 14 becomes undesirably narrow, due to these bird's beaks 15. In other words, the bird's beaks 15 substantially increases areas occupied by the isolation regions 14 on silicon substrate 11. Growth of the bird's beaks 15 is not preferred in increasing the degree of integration of semiconductor integrated circuits.

A method of forming isolation regions of silicon oxide film with growth of bird's beaks suppressed has been proposed in the prior art, as shown in FIGS. 2A and 2B.

Referring to FIG. 2A, an underlying silicon oxide film 22 is formed on a silicon substrate 21. A polysilicon layer 26 is formed by vapor deposition on underlying silicon oxide film 22. A silicon nitride film 23 is formed on polysilicon layer 26.

Referring to FIGS. 2A and 2B, silicon nitride film 23 is patterned and a pattern 23a of silicon nitride film is left only on a circuit element region. Thereafter, polysilicon film 26 and silicon substrate 21 are thermally oxidized selectively using the pattern 23a of silicon nitride film as a mask, and thus isolation regions 24 of silicon oxide film are formed.

Bird's beaks 25 are generated unavoidably in this method also. However, compared with the bird's beaks 15 of FIG. 1C, bird's beaks 25 of FIG. 2B are considerably smaller. In order to suppress growth of bird's beaks 25, it is preferred to form thick polysilicon film 26. However, if polysilicon film 26 is made thick, abnormal projecting portions 27 of isolation regions 24 grow adjacent to the upper portions of bird's beaks 25. These projections 27 have undesired influences to the following processes. For example, in the following process, undesired material may remain in a concave between the projection 27 and the bird's beak 25.

SUMMARY OF THE INVENTION

In view of the foregoing, an object of the present invention is to improved a method of forming isolation regions in a semiconductor device.

According to the present invention, a method of forming isolation regions in a semiconductor device includes the steps of: forming an underlying oxide film on a semiconductor substrate, forming a first polysilicon layer on the underlying oxide film, forming a silicon nitride film on the first polysilicon layer, patterning the silicon nitride film such that the silicon nitride film is left only on a circuit element region at which circuit elements are to be formed on the substrate, depositing selectively a second polysilicon layer by vapor deposition on regions of first polysilicon layer exposed by the patterning, and forming isolation regions of silicon oxide film by thermally oxidizing at least the second and the first polysilicon layers using the patterned nitride film as a mask.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A method of forming isolation regions in accordance with one embodiment of the present invention will be described in the following with reference to FIGS. 3A to 3D.

Figure 3A:
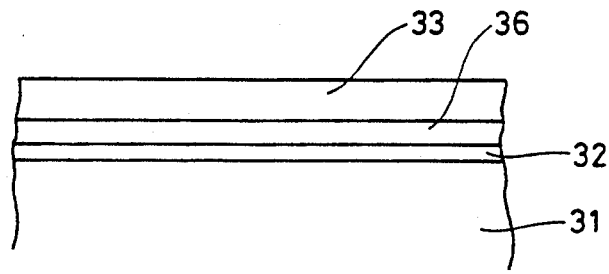
FIGS. 3A to 3D are cross sectional views showing the steps of forming isolation regions in accordance with one embodiment of the present invention.

First, referring to FIG. 3A, an underlying silicon oxide film 32 having the thickness of about 500 Å is formed by thermal oxidation on a silicon substrate 31. A relatively thin first polysilicon layer 36 having the thickness of about 200 to 500 Å is deposited by vapor deposition on underlying silicon oxide film 32. A silicon nitride film 33 having the thickness of about 1000 to 2000 Å is deposited by vapor deposition on first polysilicon layer 36. It is not preferred to form the silicon nitride film 33 to be very thick, since physical stress is generated in silicon substrate.

Figure 3B:
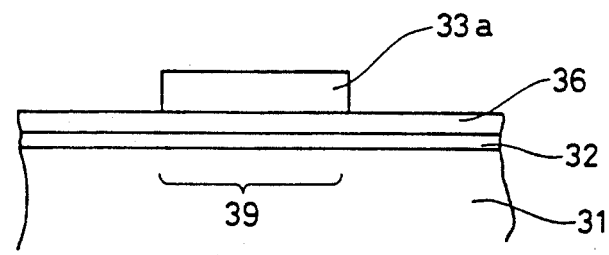

Referring to FIGS. 3A and 3B, silicon nitride film 33 is patterned by etching using photolithography, such that silicon nitride film 33a is left only on a circuit element region 39 of silicon substrate 31, at which a circuit element is to be formed. Namely, first polysilicon layer 36 is exposed at regions where isolation regions are to be formed.

Figure 3C:
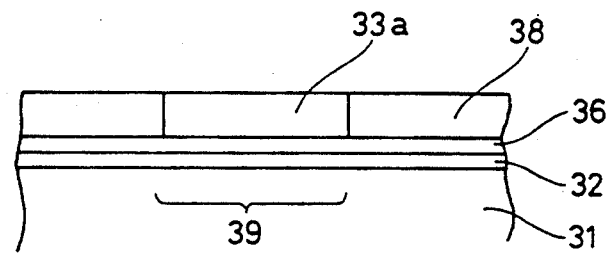

Referring to FIG. 3C, a second polysilicon layer 38 grows selectively by vapor deposition, using silicon nitride film 33a as a mask. At this time, second polysilicon layer 38 grows only on first polysilicon layer 36 with the exposed first polysilicon layer 36 being a nuclear. The second polysilicon layer 38 does not grow on silicon nitride film 33a. In order to make small the above described bird's beaks, second polysilicon layer 38 should preferably be thick. More specifically, it preferably has the same thickness as silicon nitride film 33a or thicker. For example, second polysilicon layer 38 has the thickness in the range of about 1000 to 3000 Å.

Figure 1A:
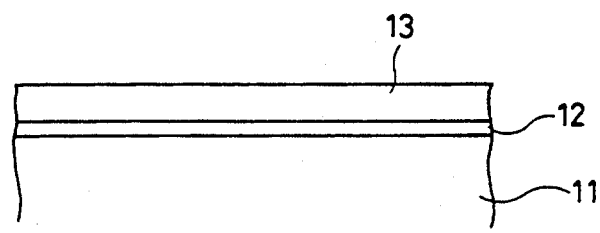
FIGS 1A to 1C are cross sectional views showing steps of forming isolation regions by the conventional LOCOS method.
Figure 1B:
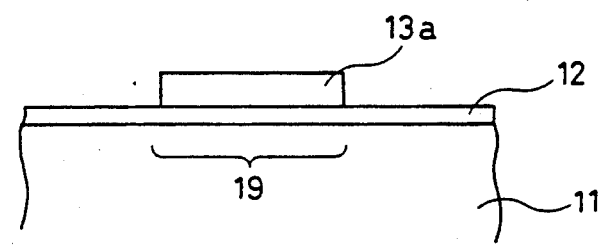
Figure 1C:
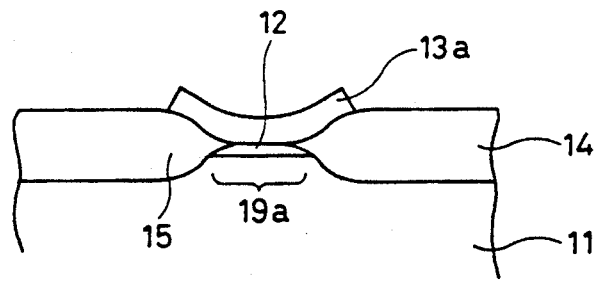
Figure 2A:
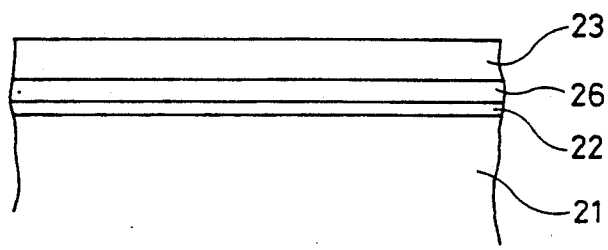
FIGS. 2A and 2B are cross sectional views showing another example of a method of forming isolation regions proposed in the prior art.
Figure 2B:
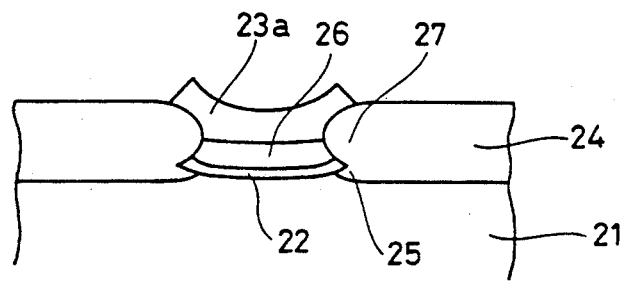
Figure 3D:
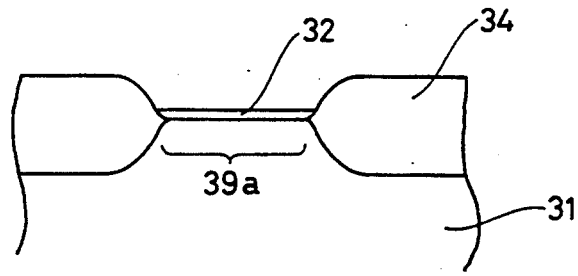

Referring to FIGS. 3C and 3D, at least second polysilicon layer 38 and first polysilicon layer 36 are thermally oxidized in an oxidizing atmosphere using the pattern 33a of silicon nitride film as a mask, and isolation regions 34 of silicon oxide are formed. During the step of thermal oxidation, at least in the period while the second polysilicon layer 38 is oxidized, reaction of oxidization proceeds only in the depth direction, and reaction in the lateral direction is prevented by side walls of silicon nitride film 33a. Since the first polysilicon layer 36 is considerably thin, abnormal projections of isolation regions such as shown in FIG. 2B are not generated. Consequently, the isolation regions 34 formed in the present embodiment includes only very small bird's beaks. More specifically, the circuit element region 39a after formation of isolation regions 34 is hardly made narrower by the bird's beaks.

Thereafter, the pattern 33a of silicon nitride film and first polysilicon layer left therebelow are removed, and an FET transistor, a bipolar transistor, a diode, a capacitor or a register is formed by a known method in the circuit element region 39a.

As described above, according to the present invention, isolation regions of an oxide can be formed while suppressing growth of bird's beaks, and therefore degree of integration of a semiconductor integrated circuit can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a isolation region in a semiconductor device, comprising the steps of:
   forming an underlying oxide film on a semiconductor substrate;
   forming a first polycrystalline silicon layer on said underlying oxide film;
   forming a silicon nitride film on said first polycrystalline silicon layer;
   patterning said silicon nitride film such that said silicon nitride film is left only on a circuit element region of said substrate at which a circuit element is to be formed;
   depositing selectively a second polycrystalline silicon layer by vapor deposition on a region of said first polycrystalline silicon layer which is exposed by said patterning; and
   forming a isolation region of silicon oxide by thermally oxidizing at least said second and first polycrystalline silicon layers using said patterned silicon nitride film as a mask.

2. A method according to claim 1, wherein said substrate is formed of silicon, and said underlying oxide film is formed by thermal oxidation.

3. A method according to claim 1, wherein said first polycrystalline silicon layer is deposited by vapor deposition.

4. A method according to claim 1, wherein said silicon nitride film is deposited by vapor deposition.

5. A method according to claim 1, wherein said silicon nitride film is patterned by photolithography.

6. A method according to claim 1, wherein said underlying oxide film is formed to have a thickness of about 500 Å.

7. A method according to claim 1, wherein said first polycrystalline silicon layer is formed to have a thickness of about 200 to 500 Å.

8. A method according to claim 1, wherein said silicon nitride film is formed to have a thickness of about 1000 to 2000 Å.

9. A method according to claim 1, wherein said second polycrystalline silicon layer is formed to have a thickness of about 1000 to 3000 Å.

* * * * *